United States Patent
Swafford et al.

(10) Patent No.: US 9,439,307 B2
(45) Date of Patent: Sep. 6, 2016

(54) LAMINATED PUNCHED SHEET METAL ELECTRONIC ENCLOSURE/SHIELD WITH INTEGRATED GASKETS

(71) Applicant: Tektronix, Inc., Beaverton, OR (US)

(72) Inventors: M. David Swafford, Gaston, OR (US); Marcus K. Da Silva, Portland, OR (US); Steve U. Reinhold, Hillsboro, OR (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/286,233

(22) Filed: May 23, 2014

(65) Prior Publication Data

US 2015/0223357 A1 Aug. 6, 2015

Related U.S. Application Data

(60) Provisional application No. 61/936,585, filed on Feb. 6, 2014.

(51) Int. Cl.
*H05K 9/00* (2006.01)
*H05K 5/02* (2006.01)
*H05K 5/04* (2006.01)

(52) U.S. Cl.
CPC .............. *H05K 5/0217* (2013.01); *H05K 5/04* (2013.01); *H05K 9/0033* (2013.01); *H05K 9/0037* (2013.01)

(58) Field of Classification Search
CPC .......................... H05K 9/0033; H05K 9/0037
See application file for complete search history.

(56) References Cited

U.S. PATENT DOCUMENTS

| | | | | |
|---|---|---|---|---|
| 5,252,782 A * | 10/1993 | Cantrell et al. | ............... | 174/387 |
| 5,581,217 A | 12/1996 | Macdonald | | |
| 5,628,058 A * | 5/1997 | Hiraki | ...................... | H04B 1/38 361/800 |
| 5,864,088 A * | 1/1999 | Sato | ...................... | H01L 23/552 174/386 |
| 6,037,846 A * | 3/2000 | Oberhammer | ..... | H01R 13/7195 174/367 |
| 6,150,606 A * | 11/2000 | Matsumoto | .......... | H05K 9/0037 174/351 |
| 6,242,690 B1 * | 6/2001 | Glover | ................. | H05K 9/0037 174/367 |
| 6,490,438 B1 * | 12/2002 | Wu | ...................... | H04B 1/3833 361/816 |
| 7,326,862 B2 * | 2/2008 | Lionetta et al. | ............... | 174/370 |
| 2005/0276027 A1 * | 12/2005 | Shen | .................... | H05K 1/0218 361/753 |

FOREIGN PATENT DOCUMENTS

DE 3902998 A1 8/1990
DE 102007048159 A1 4/2009

OTHER PUBLICATIONS

Extended European Search Report for European Patent Application No. 15154082.0, dated Jul. 9, 2015, 5 pages, European Patent Office, Munich.

* cited by examiner

*Primary Examiner* — Hung V Ngo
(74) *Attorney, Agent, or Firm* — Marger Johnson

(57) ABSTRACT

An assembly suitable for housing electronic components can include a top shield and a bottom shield, the bottom shield having a conductive outer cover, a wall section, and a laminating portion between the conductive outer cover and the wall section. The laminating portion may include laminating material. A printed circuit board (PCB) may be positioned between the top shield and the bottom shield.

9 Claims, 3 Drawing Sheets

LAMINATED PUNCHED SHEET METAL ELECTRONIC ENCLOSURE/SHIELD WITH INTEGRATED GASKETS

CROSS-REFERENCE TO RELATED APPLICATION

The present application claims the benefit of U.S. Provisional Patent Application No. 61/936,585, titled "LAMINATED PUNCHED SHEET METAL ELECTRONIC ENCLOSURE/SHIELD WITH INTEGRATED GASKETS" and filed on Feb. 6, 2014, the content of which is hereby fully incorporated by reference herein.

TECHNICAL FIELD

The disclosed technology is generally directed toward enclosures or shields for housing electronic components and, more particularly, to such enclosures or shields that include integrated gaskets.

BACKGROUND

FIG. 1 illustrates an example of a currently-available assembly 100 suitable for housing electronics. The assembly 100 includes a machined bottom shield 110 and a machined top shield 130, either or both of which have a form-in-place gasket or other gasket. The assembly 100 also includes a printed circuit board (PCB) 120 that is positioned and secured between the machined bottom shield 110 and the machined top shield 130.

A major deficiency of an assembly that includes one or more machined shields, such as the assembly 100 illustrated by FIG. 1, is the significant cost needed to machine away so much material to create not only internal cavities and external surfaces of the machined shield but also gasket stops. The machine time needed for this directly results in significantly increased production costs.

Accordingly, a need remains for cost-effective alternatives to assemblies such as the assembly 100 illustrated by FIG. 1.

SUMMARY

Embodiments of the disclosed technology generally include an assembly having a printed circuit board (PCB) that is positioned and secured between a top shield and a bottom shield, wherein at least one of the top and bottom shields is a laminated shield.

DETAILED DESCRIPTION

Figure 1:
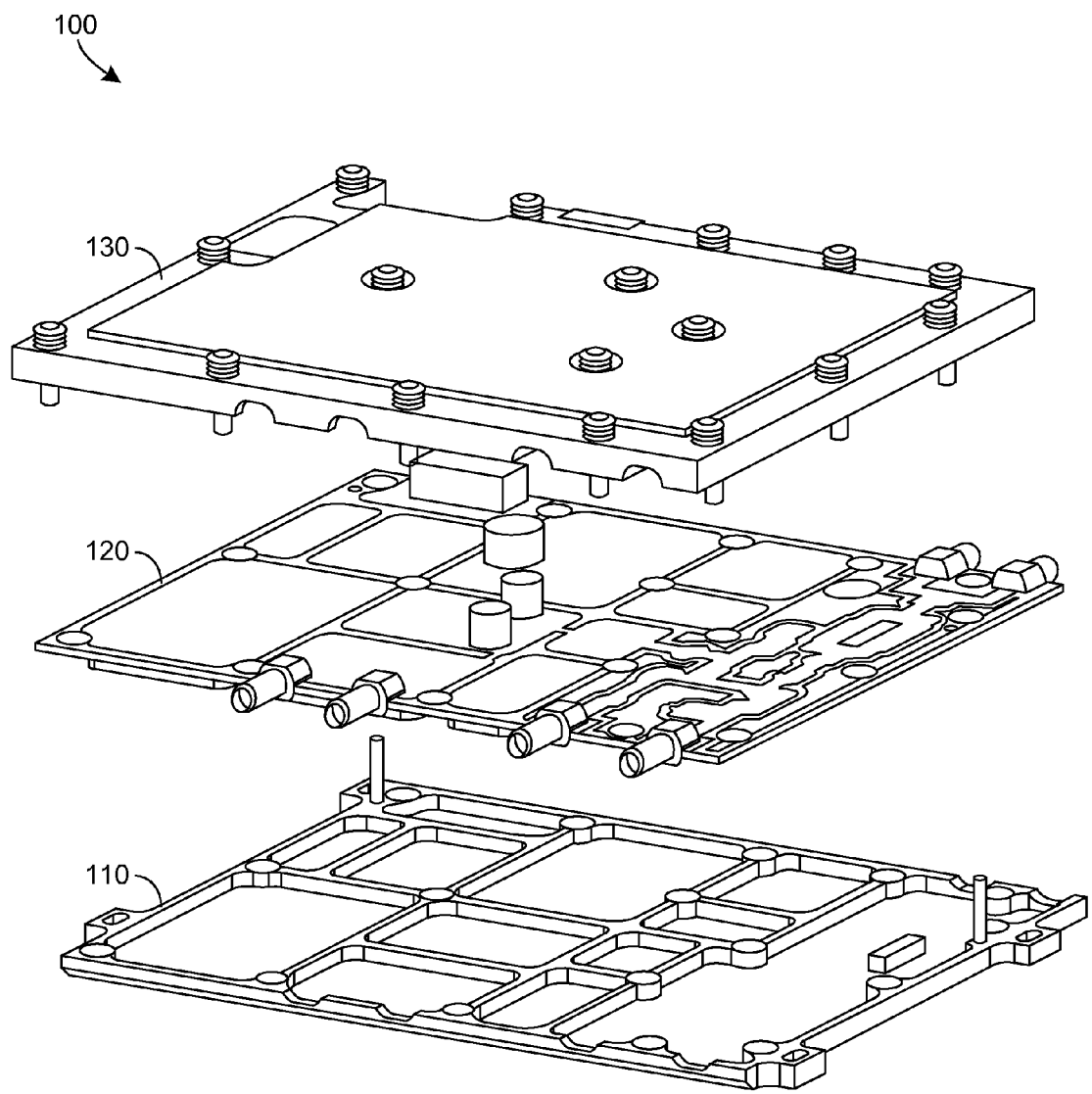
FIG. 1 illustrates an example of a currently-available assembly suitable for housing electronics.
Figure 2:
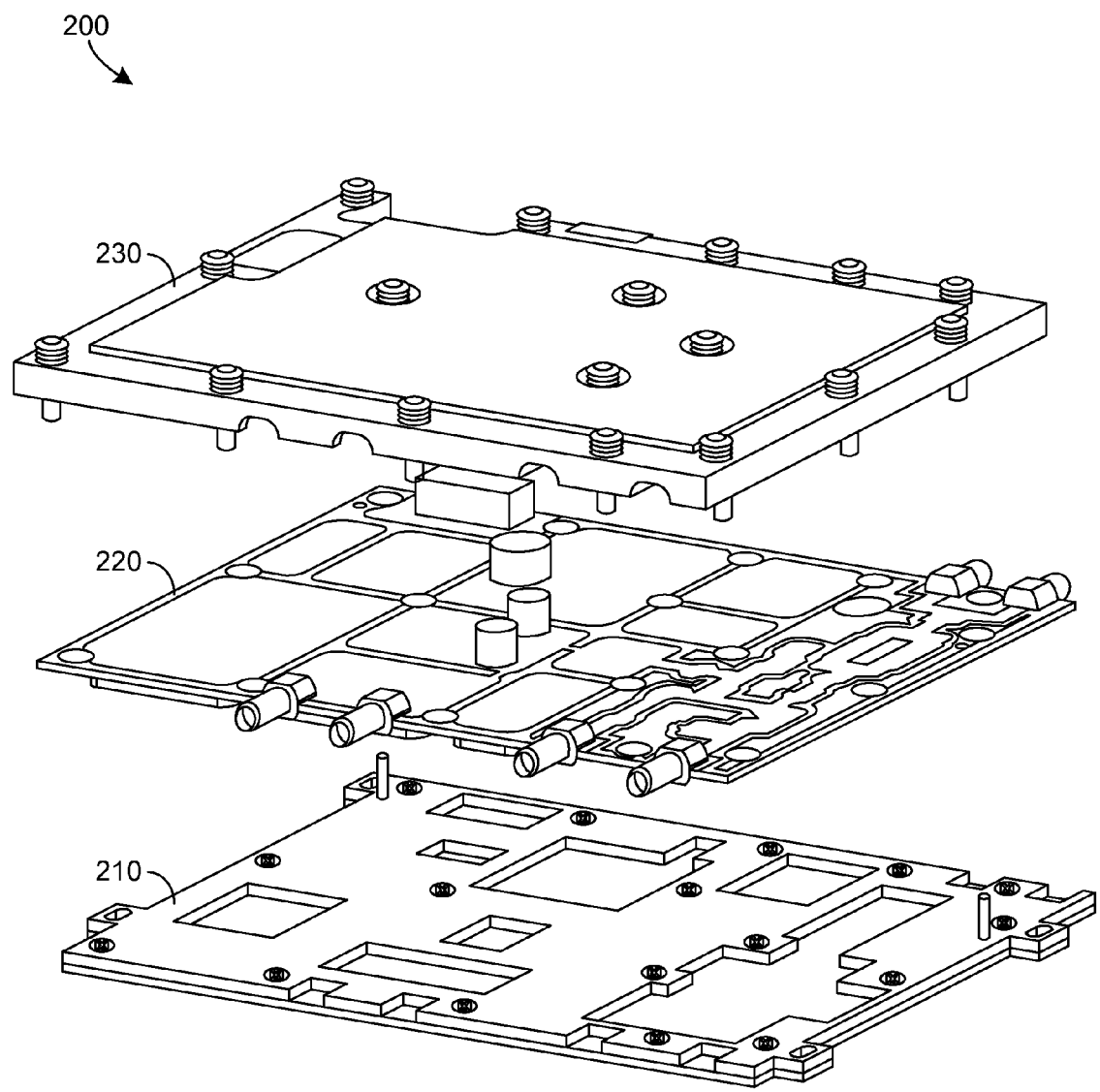
FIG. 2 illustrates an example of an assembly suitable for housing electronics in accordance with certain embodiments of the disclosed technology.

FIG. 2 illustrates an example of an assembly 200 suitable for housing electronic components in accordance with certain embodiments of the disclosed technology. In the example, the assembly 200 includes a printed circuit board (PCB) 220 positioned and secured between a laminated bottom shield 210 and a top shield 230. The top shield 230 may be either machined or laminated.

Figure 3:
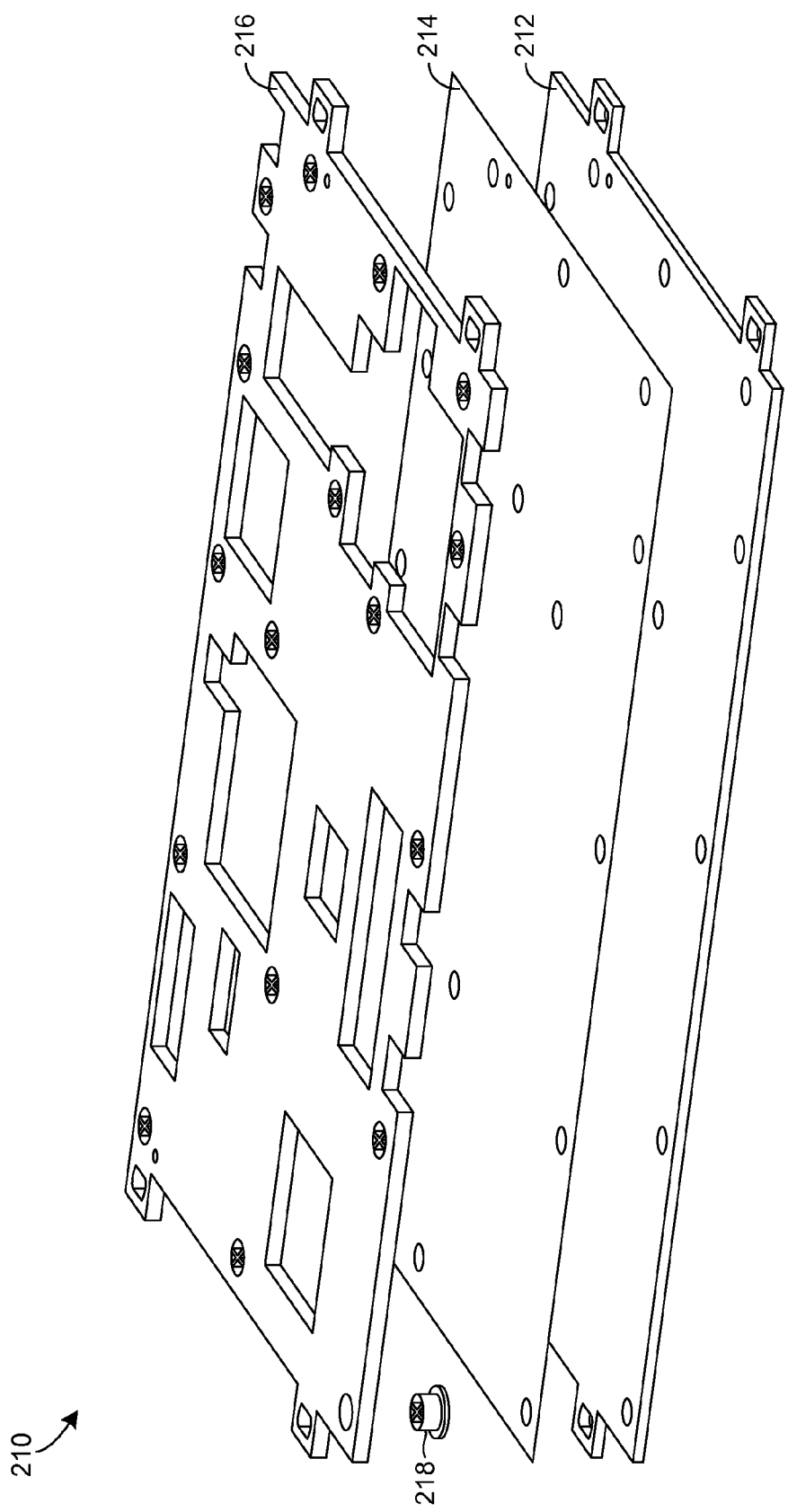
FIG. 3 illustrates a more detailed example of the laminated bottom shield illustrated by FIG. 2 in accordance with certain embodiments of the disclosed technology.

FIG. 3 illustrates a more detailed example of the laminated bottom shield 210 illustrated by FIG. 2 in accordance with certain embodiments of the disclosed technology. In the example, the bottom shield 210 includes a conductive outer cover 212 that may be attached, e.g., with a laminating material 214 of appropriate construction to match the conductive outer cover 212 and a conductive punched wall section 216. A mechanical hardware component 218 may be sized to provide proper spacing between the punched conductive wall section 216 and the PCB 220 so that the chosen gasket material is not over compressed.

The conductive outer cover 212 may be made of any suitable conductive material, such as punched aluminum, for example. In alternative embodiments, the conductive outer cover 212 may be created by techniques other than punching such as laser cutting, water jet cutting, stamping, or other suitable metal cutting process, for example. If additional component height is needed above the height of the punched wall section 216, the outer cover 212 may be dimpled or have secondary parts attached thereto in order to provide the additional height.

The laminating material 214 is generally selected based on the materials chosen to be laminated as well as the electrical attenuation required. Consider an example in which the outer cover 212 and wall section 216 are both constructed from aluminum. In such example, appropriate laminating materials that can be used will generally include double-sided conductive adhesive, aluminum solder paste, aluminum solder preforms, conductive epoxy, and sheet gasket with double-sided adhesive, for example.

Other laminating methods may include the use of mechanical fasteners such as rivets, spot welds, screws, or PEM hardware to trap a gasket or gasket-like material between the outer cover 212 and the wall section 216. The gasket materials used may include dimpled sheet gasket, woven screen, sheet gasket, or dielectric absorber, for example.

The punched conductive wall section 216 may also be made of any conductive material, such as aluminum, for example. Clearance cavities may be punched to provide space for tall PCB components, e.g. components that cannot fit under the gap provided by the gasket stops. In such cases, the gasket stops may provide 0.025" clearance above the PCB top layer and the open cavities may provide 0.125" clearance, for example. Greater or lesser clearance may be provided in other embodiments. Additional clearance may be provided by either using thicker sheet metal or, if needed due to vendor punch press limitations, by laminating multiple wall sections, for example.

The laminated punched sheet metal approach according to embodiments of the disclosed technology is generally less costly in both the punch process used as well as the time to make the parts. Even in the event that secondary milling operations are required, the savings from elimination of the need to mill the entire shield from a billet of metal is substantial. Due to the cost of milling vs. punched operations, producers tend to procure the milled shields from distant sources, further increasing the time from conception to parts due to shipping. By moving to a punched process, there may be a compelling financial motivation to build the parts locally thus reducing the time from concept to parts.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. An assembly suitable for housing electronic components, the assembly comprising:
    a top shield;
    a bottom shield coupled with the top shield, the bottom shield including:
        a conductive outer cover;
        a wall section; and
        a laminating portion between the conductive outer cover and the wall section, the laminating portion comprising laminating material that substantially covers a surface of the conductive outer cover;
    a printed circuit board (PCB) positioned between the top shield and the bottom shield; and
    at least one mechanical hardware component configured to provide proper spacing between the wall section of the bottom shield and the PCB.

2. The assembly of claim 1, wherein the wall section is a conductive punched wall section.

3. The assembly of claim 1, wherein the conductive outer cover is made of punched aluminum.

4. The assembly of claim 1, wherein the wall section is constructed from aluminum.

5. The assembly of claim 1, wherein the laminating material includes at least one from a group consisting of: double-sided conductive adhesive, aluminum solder paste, aluminum solder preforms, conductive epoxy, and sheet gasket with double-sided adhesive.

6. The assembly of claim 1, further comprising at least one mechanical fastener configured to trap a gasket or gasket-like material between the conductive outer cover and the wall section.

7. The assembly of claim 6, wherein the at least one mechanical fastener includes at least one from a group consisting of: rivets, spot welds, screws, and PEM hardware.

8. The assembly of claim 6, wherein gasket-like material includes at least one from a group consisting of: dimpled sheet gasket, woven screen, sheet gasket, and dielectric absorber.

9. The assembly of claim 1, wherein the wall section includes at least one clearance cavity punched therein to provide extra space for at least one component on the PCB.

* * * * *